United States Patent
Michalak et al.

(10) Patent No.: US 7,590,021 B2
(45) Date of Patent: Sep. 15, 2009

(54) SYSTEM AND METHOD TO REDUCE DYNAMIC RAM POWER CONSUMPTION VIA THE USE OF VALID DATA INDICATORS

(75) Inventors: Gerald Paul Michalak, Cary, NC (US); Barry Joe Wolford, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 223 days.

(21) Appl. No.: 11/828,569

(22) Filed: Jul. 26, 2007

(65) Prior Publication Data

US 2009/0027989 A1    Jan. 29, 2009

(51) Int. Cl.
*G11C 7/00* (2006.01)

(52) U.S. Cl. .................. 365/222; 365/189.14

(58) Field of Classification Search ........... 365/222, 365/189.14

See application file for complete search history.

(56) References Cited

U.S. PATENT DOCUMENTS

| | | | |
|---|---|---|---|
| 6,415,353 B1 * | 7/2002 | Leung | 711/106 |
| 6,721,223 B2 | 4/2004 | Matsumoto et al. | |
| 6,742,097 B2 | 5/2004 | Woo et al. | |
| 7,079,440 B2 | 7/2006 | Remaklus | |
| 7,088,633 B2 | 8/2006 | Remaklus | |
| 7,184,350 B2 | 2/2007 | Remaklus | |
| 7,236,416 B2 | 6/2007 | Walker | |
| 7,342,841 B2 | 3/2008 | Jain et al. | |
| 2003/0217246 A1 | 11/2003 | Kubota et al. | |
| 2004/0093461 A1 | 5/2004 | Kim | |
| 2006/0002217 A1 | 1/2006 | Walker | |
| 2006/0112217 A1 | 5/2006 | Walker | |
| 2006/0143372 A1 | 6/2006 | Walker | |

OTHER PUBLICATIONS

European Search Report-EP08005492, Search Authority-Munich Patent OfficeOct. 24, 2008.
International Search Report-PCT/US08/071153, International Search Authority-European Patent Office-Nov. 12, 2008.
Written Opinion-PCT/US08/071153, International Search Authority-European Patent Office-Nov. 12, 2008.

* cited by examiner

*Primary Examiner*—Son Dinh
(74) *Attorney, Agent, or Firm*—Nicholas J. Pauley; Peter M. Kamarchik; Sam Talpalatsky (57) ABSTRACT

A DRAM or SDRAM component maintains an indicator that indicates whether or not an independently refreshable memory unit of a DRAM array, such as a row, contains valid data. When a refresh operation is directed to the associated memory, the refresh operation is suppressed if the memory does not contain valid data. Significant power savings may be realized by suppressing refresh operations directed to invalid data.

30 Claims, 6 Drawing Sheets (PRIOR ART)
FIG. 1

SYSTEM AND METHOD TO REDUCE DYNAMIC RAM POWER CONSUMPTION VIA THE USE OF VALID DATA INDICATORS

FIELD OF THE INVENTION

The present invention relates generally to the field of memory and in particular to a system and method for reducing dynamic RAM power consumption.

BACKGROUND

Solid-state dynamic random access memory (DRAM) is a cost-efficient bulk memory solution for many modern computing systems, including portable electronic devices. DRAM, including synchronous DRAM (SDRAM), offers a high bit density and relatively low cost per bit compared to faster, on-chip memory structures such as registers, static RAM (SRAM), and the like, and dramatically higher access speeds than electron, magneto-, or optical-mechanical bulk storage such as hard disks, CD-ROMs, and the like.

Figure 1:
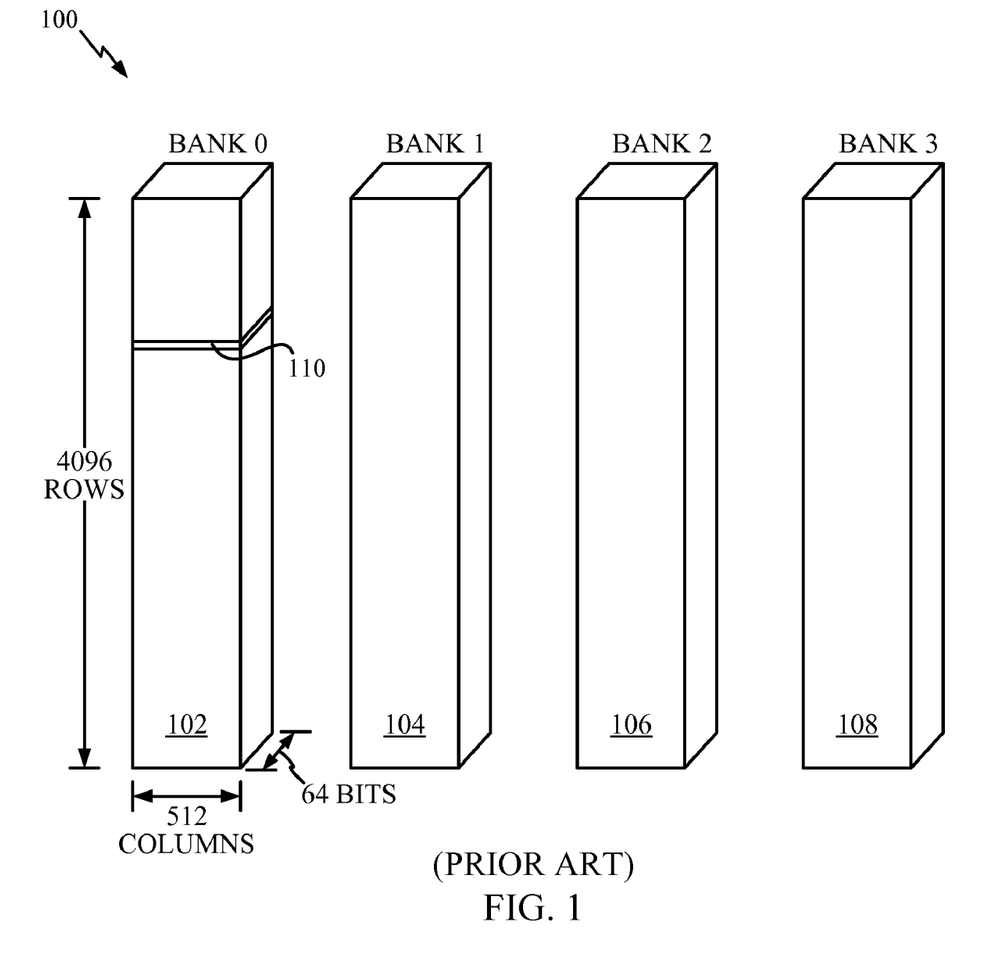
FIG. 1 is a functional block diagram of data organization in a DRAM array.

FIG. 1 depicts a logical view of a representative 512 Mbit DRAM array 100. The array 100 is organized as a plurality of separately addressable banks 102, 104, 106, 108. Each bank is divided into a large number, e.g., 4096, of rows 110. Each row 110 is divided into a plurality of columns (e.g., 512 columns), and each column includes a number of data bits, typically organized as bytes (e.g., 8 bytes). Several data addressing schemes are known in the art. For example, in Bank, Row, Column (BRC) addressing, a memory address may be interpreted as

| 31-26 | 25-24 | 23-12 | 11-3 | 2-0 |
|---|---|---|---|---|
| Chip select | Bank select | Row select | Column select | Byte select |

In an alternative addressing scheme such as Row, Bank Column (RBC) addressing, the memory address may be interpreted as

| 31-26 | 25-14 | 13-12 | 11-3 | 2-0 |
|---|---|---|---|---|
| Chip select | Row select | Bank select | Column select | Byte select |

DRAM memory arrays are volatile; data stored in a DRAM array must be refreshed periodically to maintain its integrity. During a DRAM refresh operation, a large number of data storage locations are simultaneously read out of the array 100 and recharged. Conventionally, DRAM arrays are refreshed row-by-row. That is, a row—or, in some implementations, the same row simultaneously in every bank—is selected and all data within the row are refreshed in a single operation. As used herein, the term "independently refreshable memory unit," or IRMU, refers to the quantum of data that is refreshed in a single refresh operation. The IRMU for a DRAM array is typically a row, although the present invention is not limited to row-by-row refresh operations.

Refresh operations directed to a IRMU are conventionally interspersed with memory accesses, and are timed such that the entire DRAM array is refreshed prior to any data being lost due to charge decay. Traditionally, the refresh addresses—that is, the address of each independently refreshable memory unit—are supplied by a memory controller, such as a processor, which specifies a refresh operation through a unique combination of control signals. Modern SDRAM components may include two additional refresh modes: self-refresh and auto-refresh. In both modes, the SDRAM component includes an internal refresh address counter. Self-refresh is utilized in many systems, such as battery-powered electronic devices, that employ a "sleep" mode to conserve power. In self-refresh mode, the SDRAM component is not accessible to store or retrieve data; however, the SDRAM performs refresh operations internally to ensure the integrity of stored data. In auto-refresh mode, the memory controller specifies a refresh operation, but does not provide a refresh address. Rather, the SDRAM component increments an internal refresh address counter, which provides successive independently refreshable memory unit (e.g., row) addresses.

Each refresh operation consumes power as data are read from the DRAM array and recharged. However, particularly following power-on or a system reset, most memory storage locations in the DRAM array do not contain valid data.

SUMMARY

According to one or more embodiments disclosed and claimed herein, an indicator is maintained that indicates whether or not a refreshable segment of memory contains valid data. When a refresh operation is directed to the associated memory, the refresh operation is suppressed if the memory does not contain valid data. Significant power savings may be realized by suppressing refresh operations directed to invalid data.

One embodiment relates to a method of refreshing dynamic memory. An indicator is associated with each independently refreshable memory unit. Upon writing data to an independently refreshable memory unit, the associated indicator is set to reflect valid data. Only the independently refreshable memory units whose associated indicator reflects valid data stored therein are refreshed.

One embodiment relates to a DRAM component. The DRAM component includes a DRAM array operative to store data and organized as a plurality of independently refreshable memory units. The DRAM component also includes a plurality of indicators, each associated with an independently refreshable memory unit and indicating whether valid data is stored in the independently refreshable memory unit. The DRAM component further includes a controller receiving control signals and operative to inspect the indicators and to refresh only the independently refreshable memory units storing valid data.

DETAILED DESCRIPTION

Figure 2:
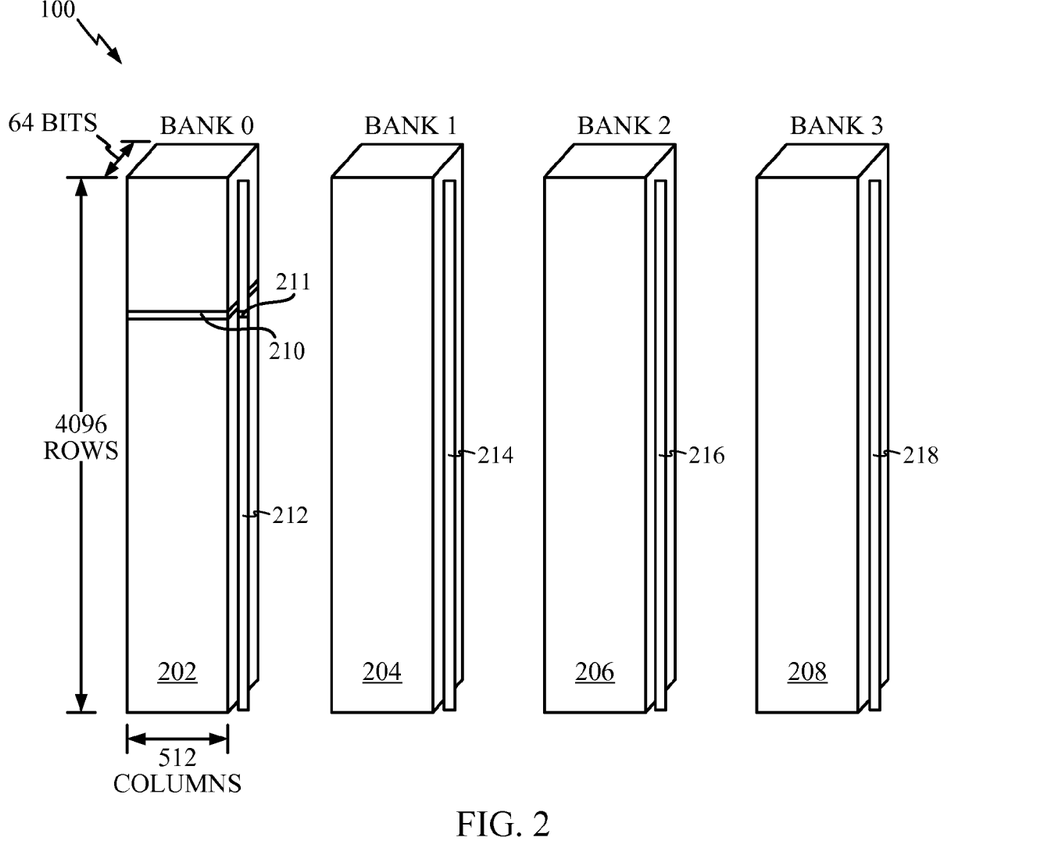
FIG. 2 is a functional block diagram of data organization in a DRAM array, with a valid indicator or bit associated with each independently refreshable memory unit.

FIG. 2 depicts a logical view of a DRAM array 200 organization according to one embodiment. The array 200 is logically organized as four banks 202, 204, 206, 208, each bank comprising 4096 rows. A representative row is depicted as 210. In this embodiment, a row 210 is the smallest independently refreshable memory unit. Associated with row 210 in the array 200 is an indicator 211 reflecting whether or not the row 210 contains valid data. In the embodiment depicted, each indicator 211 comprises a single bit, also referred to herein as a valid bit, associated with each row. FIG. 2 depicts sets of indicator bits 212, 214, 216, 218, each indicator bit associated with a row in banks 202, 204, 206, 208, respectively. In an embodiment where the smallest independently refreshable memory unit comprises a row spanning all four banks 202, 204, 206, 208, only one set of indicator bits 212 would be required.

During a refresh operation, the indicator or valid bit, e.g. indicator 211, associated with the currently addressed independently refreshable memory unit, e.g. IRMU 210, is inspected. If the indicator bit is set, indicating the associated IRMU contains valid data, a refresh operation is performed on the IRMU to maintain the data. If the indicator bit is not set, indicating the associated IRMU does not contain valid data, in one embodiment the refresh operation is suppressed, conserving power that would otherwise be consumed in refreshing the IRMU. Thus, only IRMUs that contain valid data will be refreshed, and IRMUs in the array that are in an uninitialized or "don't care" state are not refreshed. The refresh address may be supplied by a memory controller, or may be generated by an internal address counter, such as during auto-refresh or self-refresh.

The indicator bits may be maintained in a variety of ways. In one embodiment, indicator bits are stored in a fixed or programmable part of the memory array 200. In this case, the usable size of the array 200 is reduced by 0.003%. In another embodiment, indicator bits are stored on the DRAM/SDRAM component in memory other than the DRAM array 200, such as in a static RAM structure, in registers, or the like. In one embodiment, the IRMU valid indicator memory is accessed via 2-cycle sequence similar to Mode Register and Extended Mode Register access sequences of SDRAM components.

Figure 3:
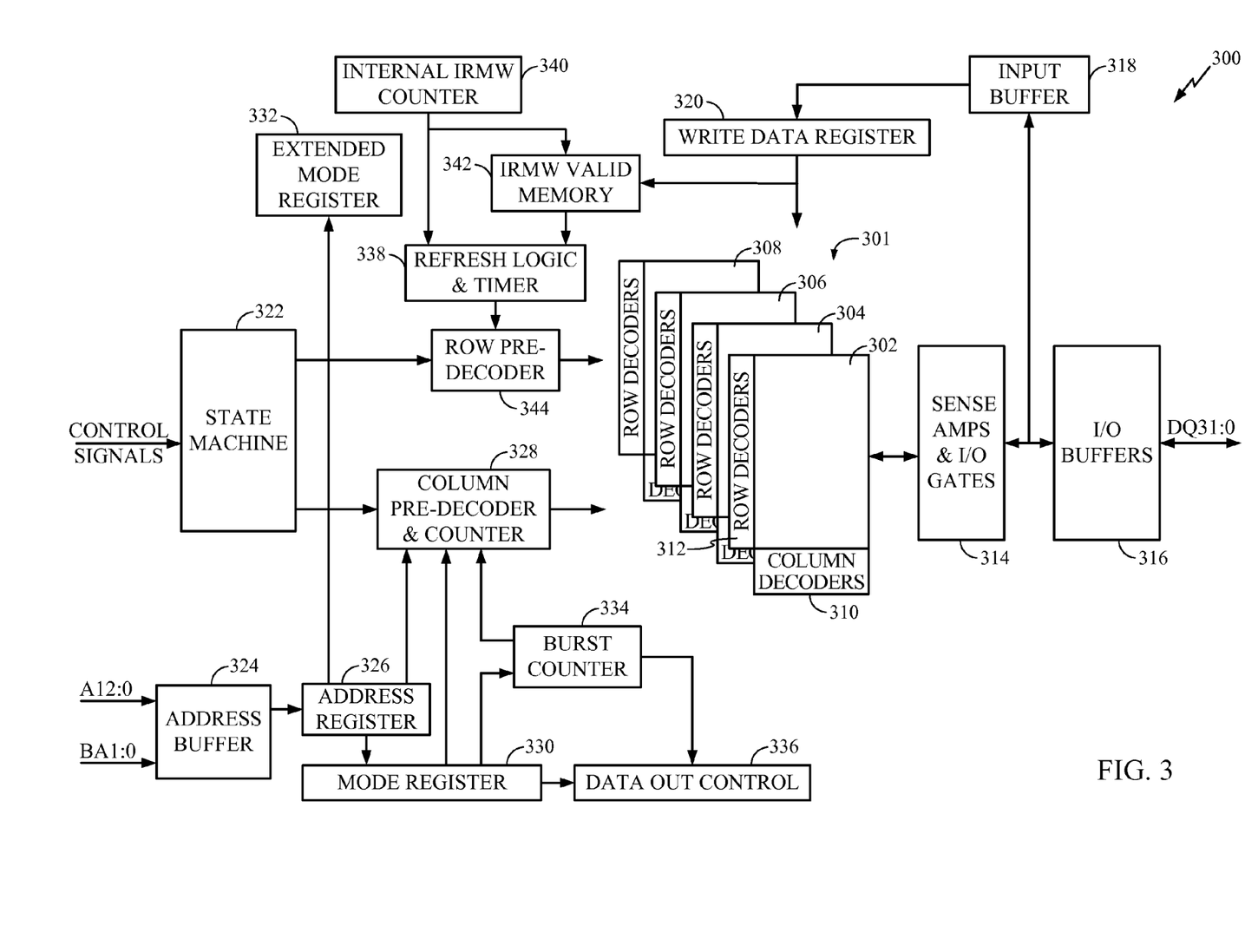
FIG. 3 is a functional block diagram of an SDRAM component.

FIG. 3 is a functional block diagram of an SDRAM component 300 according to one embodiment. The SDRAM 300 includes a DRAM array 301, organized as four banks 302, 304, 306, 308. Each bank includes row and column decoders 312, 310. Sense amplifiers 314 provide read data from the DRAM array 301 to I/O buffers 316. Write data from the I/O buffers 316 passes through input buffer 318 and is stored in a write data register 320 prior to writing into the DRAM array 301.

Operation of the SDRAM component 300 is controlled by a state machine 322. Bank and memory addresses are input to an address buffer 324 and stored in an address register 326, where they control the column pre-decoder and counter circuit 328. The Mode Register 330 and Extended Mode Register 332 store mode selection bits such as Column Address Strobe (CAS) delay, burst length, and the like, which control operation of the burst counter 334 and the data out control circuit 336.

A refresh logic and timer circuit 338 receives IRMU addresses from an internal counter 340, and IRMU valid bits from IRMU valid memory 342. The refresh logic outputs IRMU addresses to a row pre-decoder 344. Note that while the IRMU valid memory 342 is depicted in FIG. 3 as functional block separate and apart from the DRAM array 301, the memory physically dedicated to the storage of IRMU valid indicators may be part of the DRAM array 301, or may be separate DRAM, SRAM, registers, or other memory.

In one embodiment, the SDRAM component 300 automatically monitors write addresses, and sets an IRMU valid indicator corresponding to the IRMU to which each write operation is directed. The refresh logic 338 then inspects the IRMU valid memory 342 upon each refresh operation, and suppresses refresh cycles directed to any IRMU that does not contain valid data. This minimizes the power consumption of the SDRAM component 300, but does not require any refresh-suppression knowledge or participation by a memory controller or a processor. The major power savings are likely to occur following power-on or reset, when the DRAM array 301 is mostly empty of valid data. As the memory controller writes data to more IRMUs in the DRAM array 301, more IRMU valid bits are set, and fewer refresh cycles are suppressed. In this embodiment, the IRMU memory 342 is automatically cleared as part of the SDRAM component 300 initialization following power-up or reset. This embodiment allows system designers to take advantage of the lower power consumption of the SDRAM component 300, while utilizing existing memory controllers and software that do not include sophisticated memory management functionality.

In one embodiment, the IRMU memory 342 may be cleared by a command from the memory controller, such as a predefined Mode Register 330 or Extended Mode Register 332 write operation or bit pattern. This embodiment allows for reduced SDRAM component 300 power consumption following a soft (i.e., software-initiated) reset, but requires that the memory controller issue an IRMU memory 342 clear command.

Figure 4:
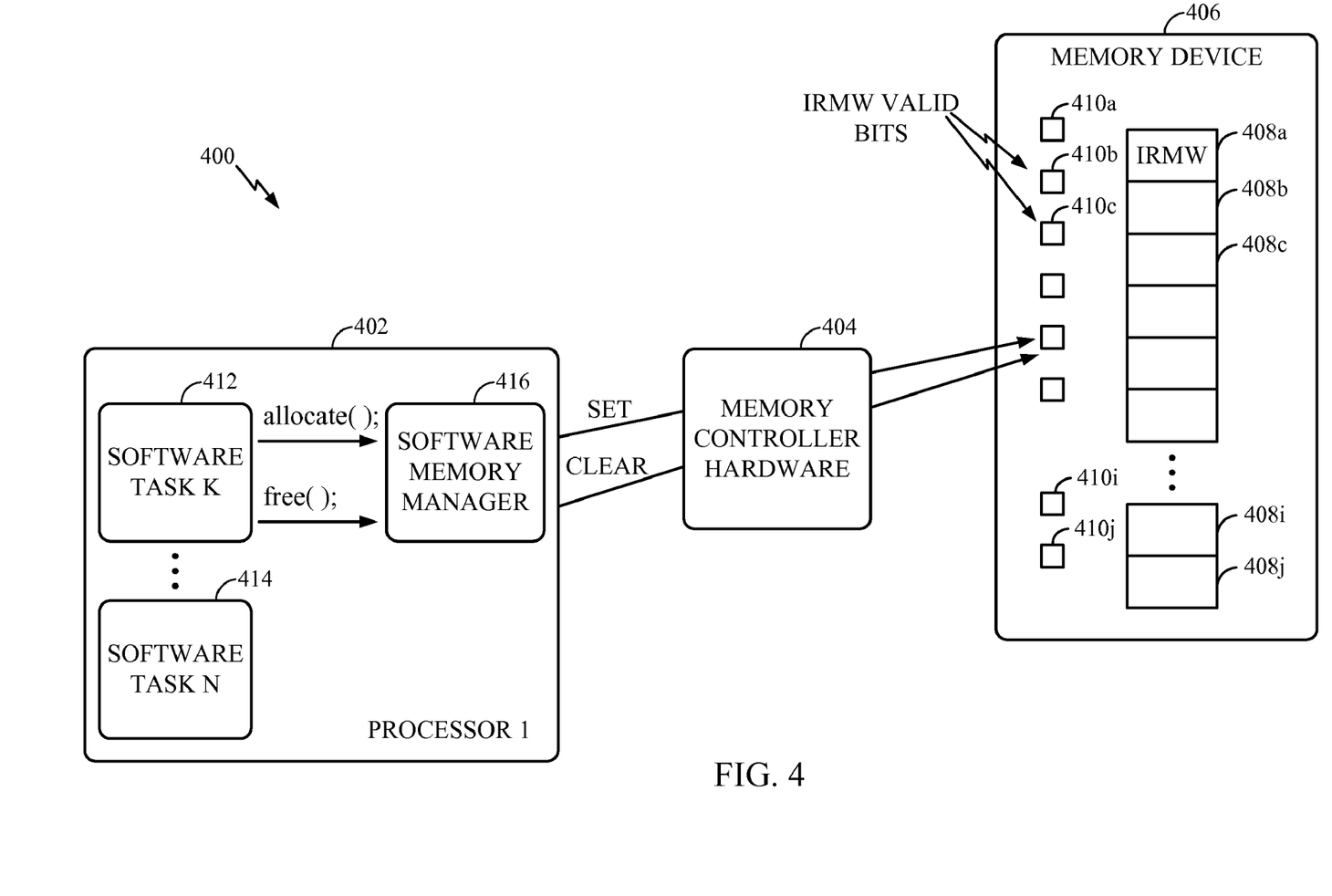
FIG. 4 is a functional block diagram of a single-processor computing system.

FIG. 4 depicts a computing system 400 that controls and reduces DRAM power consumption. The system 400 includes a memory controller such as a processor 402, memory controller hardware 404 (which may be integrated with the processor 402), and a memory device such as SDRAM component 406. A DRAM array within the SDRAM component 406 is logically divided into independently refreshable memory units 408a, 408b, 408c, ... 408j. Associated with each IRMU is an IRMU valid indicator such as a bit 410a, 410b, 410c, ... 410j, which indicates whether the associated IRMU contains valid data.

A plurality of software tasks 412, 414 execute on the processor 402. Each software task may allocate memory for data storage, and may free up memory no longer needed. A Software Memory Manager 416 is a software module that manages memory for the processor 402. The Software Memory Manager 416 receives memory "allocate" and/or "free" requests from software tasks 412, 414. In response, the Software Memory Manager 416 allocates memory to and from the tasks 412, 414, maps the allocated memory to one or more independently refreshable memory units 408a, 408b, 408c, ... 408j (e.g., rows), and sets and clears the corresponding IRMU valid indicators 410a, 410b, 410c, ... 410j to reflect the status of data currently in the IRMUs 408a, 408b, 408c, ... 408j. In one embodiment, the actual memory controller is an independent hardware element 404; in another embodiment, the memory controller functionality is integrated into the processor 402. The SDRAM component 406 suppresses all refresh operations directed to IRMUs 408a, 408b, 408c, ... 408j that contain invalid data.

Figure 5:
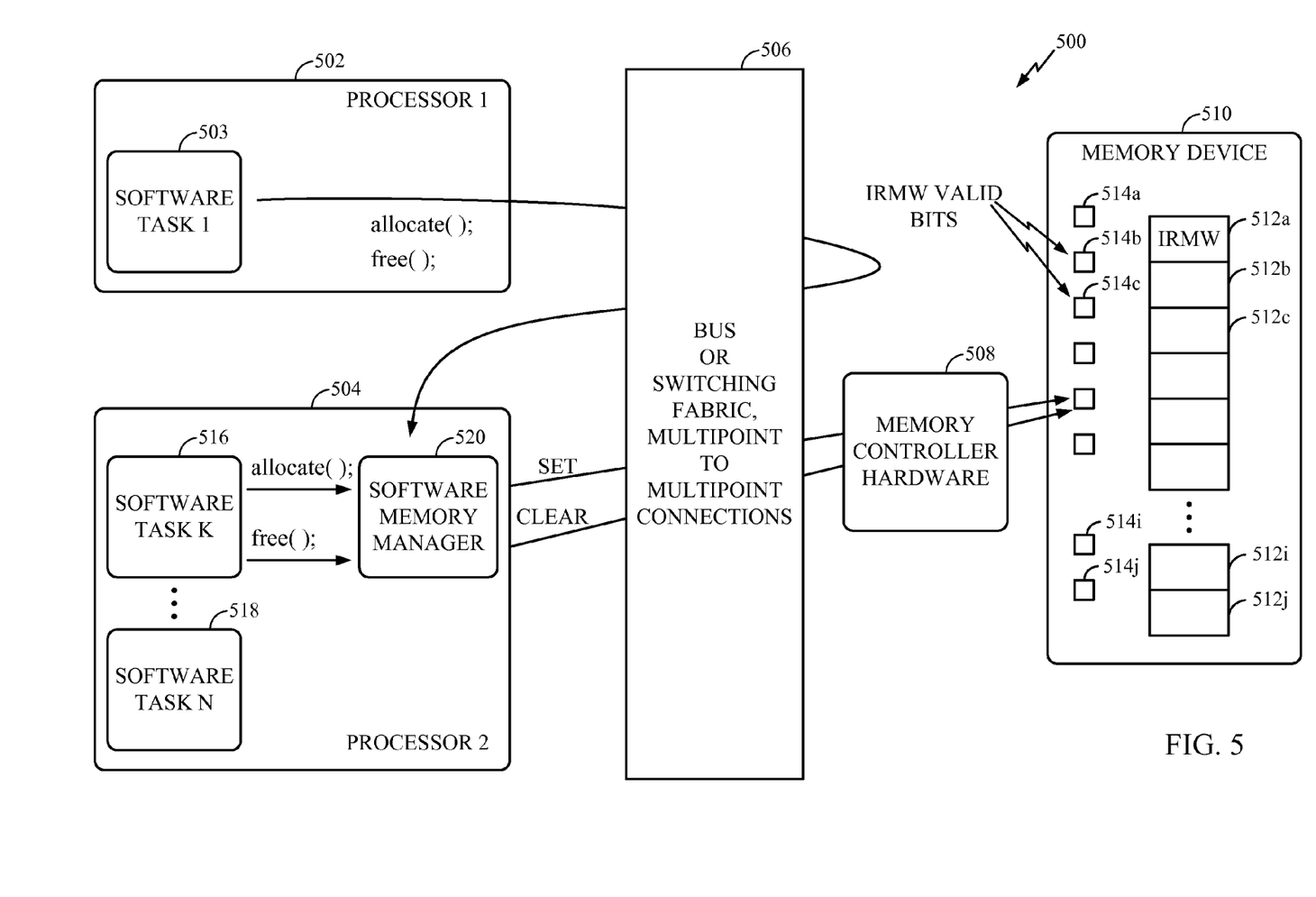
FIG. 5 is a functional block diagram of a multi-processor computing system.

FIG. 5 depicts a multiprocessor system 500 that controls memory allocation and minimizes SDRAM power consumption. Processors 502, 504 communicate with each other and with memory controller hardware 508 across a system bus 506. The bus 506 may also be implemented as a switching fabric, a crossbar switch, or the like, as known in the art. One or more software tasks 503, 516, 518 execute on the processors 502, 504. A system-wide Software Memory Manager 520 executes on one processor 504, allocating memory to and from all software tasks 503, 516, 518 executing in the system. Any software task 503 executing on a processor 502 may send memory allocate and free requests to the Software Memory Manager 520 across the bus 506. As described above, the Software Memory Manager 520 allocates memory to and from the tasks 503, 516, 518, maps the allocated memory to one or more independently refreshable memory units 512a, 512b, 512c, . . . 512j, and sets and clears the corresponding IRMU valid indicators 514a, 514b, 514c, . . . 514j via the memory controller hardware 508 to reflect the status of data currently stored in the IRMUs 512a, 512b, 512c, . . . 512j. The SDRAM component 510 suppresses refresh operations directed to IRMUs 512a, 512b, 512c, . . . 512j that contain invalid data.

In conventional refresh mode, auto-refresh mode, or self-refresh mode, the SDRAM component 300, 406, 510 compares refresh addresses (supplied by a memory controller or an internal counter) to IRMU valid memory 342, 410, 514, and suppresses refresh operations directed to IRMUs 408, 512 that do not contain valid data. In one embodiment, in which a Software Memory Manager 416, 520 actively manages memory and sets/clears IRMU valid bits 410, 514, the system may further optimize memory refreshing and minimize power consumption by dynamically suppressing refresh commands to IRMUs as physical memory is freed from allocation to a software task and returned to the "pool," in which case its data contents are not relevant.

In conventional refresh mode, the Software Memory Manager 416, 520 may provide refresh addresses only to IRMUs 408, 512 that contain valid data. In auto-refresh or self-refresh mode, the SDRAM component 300, 406, 510 may "skip" invalid memory by incrementing its refresh address counter to the next IRMU 408, 512 containing valid data, following each refresh operation. In either case, the memory controller 404, 508 may increase the delay between refresh operations, such that only the IRMUs 408, 512 that contain valid data are all refreshed with the maximum refresh period. In this embodiment, no refresh commands are suppressed by the SDRAM component 300, 406, 510. This further optimizes power consumption (and reduces bus congestion) by avoiding unnecessary memory command cycles, and reduces the delay refresh commands impose on ongoing memory accesses.

Figure 6:
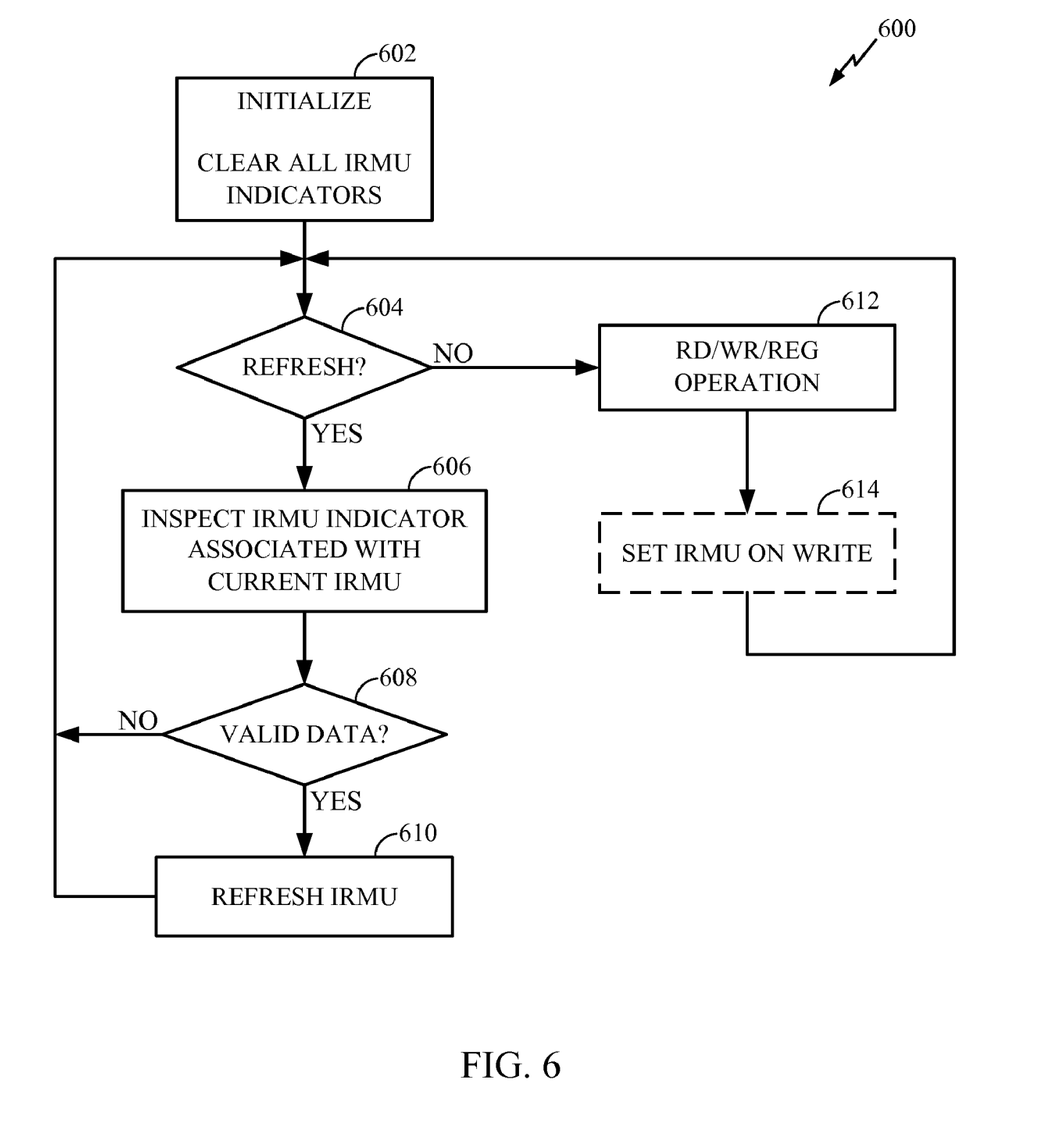
FIG. 6 is a flow diagram of a method of refreshing a DRAM array.

FIG. 6 depicts a method 600 of refreshing DRAM according to one or more embodiments. Upon initialization, all IRMU indicators are cleared (block 602). The methods then checks whether a refresh operation is to be performed (block 604). In a traditional refresh mode, a refresh operation is indicated by control signals sent to the DRAM component from a memory controller, and the IRMU to be refreshed is indicated on the address bus. In auto-refresh mode, the refresh operation is commanded by a memory controller, and an internal counter provides an IRMU refresh address. In self-refresh mode, expiration of a refresh timer indicates a refresh operation is required, and an internal counter provides the IRMU address.

If a refresh operation is indicated (block 604), the IRMU indicator associated with the current IRMU address (such as, for example, a row address) is inspected (block 606). If the IRMU indicator indicates that the IRMU contains valid data (block 608), a refresh operation is performed on the addressed IRMU (block 610). If the IRMU indicator indicates that the IRMU does not contain valid data (block 608), the refresh operation is suppressed, saving the power that would otherwise be expended by refreshing invalid (or "don't care") data.

In self-refresh mode, the SDRAM component waits at block 604 for the next expiration of the refresh address counter. In other refresh modes, if a refresh operation is not commanded (block 604), the DRAM (or SDRAM) component executes read, write, and/or register access operations as commanded by a memory controller (block 612). In one embodiment, where a memory management software module allocates and frees memory blocks, the memory or register access operations may include operations directed to IRMU memory—reading, setting, and clearing the IRMU indicators. In one embodiment, an IRMU indicator is automatically set upon a write operation directed to the associated IRMU (block 614). In this embodiment, the IRMU indicators are only clear upon initialization (block 602), but may provide significant power savings until valid data is written at least once to many IRMUs.

By applying a software paradigm of memory management—where memory is only relevant when it is allocated to a task and assumes a "don't care" state prior to allocation or after being freed—to the physical refresh operations of a DRAM array, significant power savings may be realized by eliminating unnecessary refresh operations directed to segments of memory that do not hold valid data. In one embodiment, the tracking of valid data, by setting associated IRMU bits, is automatic. In this embodiment, the power-saving benefits of the present invention are available in systems with no software memory management or knowledge of the ability to selectively suppress refresh operations. In other embodiments, direct control of the IRMU memory allows for sophisticated memory management and maximum power savings.

As used herein, the term "independently refreshable memory unit," or IRMU, refers to the quantum of data that is refreshed in a single refresh operation. The IRMU for a DRAM array is typically a row, although the present invention is not so limited. As used herein, the term "set" refers to writing data to an IRMU indicator to indicate that valid data is stored in the associated IRMU, regardless of the value of the data (e.g., 0 or 1, or a multi-bit pattern). "Clear" refers to writing data to an IRMU indicator to indicate that valid data is not stored in the associated IRMU, regardless of the value of the data (e.g., 0 or 1, or a multi-bit pattern). As used herein, "DRAM array" refers to a dynamic random access memory array, which stores data in both DRAM and SDRAM integrated circuit components. As used herein, the scope of the terms "DRAM" alone or "DRAM component" include both asynchronous DRAM memory components and SDRAM components. As used herein, the term "allocate" refers to assigning a range of memory addresses to a software task, and the term "free" refers to returning previously allocated memory addresses to a pool of unallocated memory.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of refreshing dynamic memory, comprising:
   associating an indicator with each independently refreshable memory unit;
   upon writing data to an independently refreshable memory unit, setting the associated indicator to reflect valid data; and
   refreshing only the independently refreshable memory units whose associated indicator reflects valid data stored therein.

2. The method of claim 1 wherein the independently refreshable memory unit is a row.

3. The method of claim 1 wherein the independently refreshable memory unit comprises a row across two or more memory banks.

4. The method of claim 1 wherein the indicator is a valid bit.

5. The method of claim 4 wherein the valid bit is stored in a DRAM array.

6. The method of claim 4 wherein the valid bit is stored in static memory.

7. The method of claim 4 wherein the valid bit is stored in a register.

8. The method of claim 1 wherein setting the associated indicator to reflect valid data comprises automatically setting the indicator upon writing data to the associated independently refreshable memory unit.

9. The method of claim 1 wherein setting the associated indicator to reflect valid data comprises setting the indicator on command from a memory controller.

10. The method of claim 1 wherein indicators set to reflect valid data are cleared on reset.

11. The method of claim 1 wherein indicators set to reflect valid data are cleared on command from a memory controller.

12. The method of claim 1 wherein refreshing only the independently refreshable memory units whose associated indicator reflects valid data stored therein comprises self-refreshing only the independently refreshable memory units whose associated indicator reflects valid data stored therein.

13. The method of claim 1 wherein refreshing only the independently refreshable memory units whose associated indicator reflects valid data stored therein comprises auto-refreshing only the independently refreshable memory units whose associated indicator reflects valid data stored therein.

14. The method of claim 1 wherein refreshing only the independently refreshable memory units whose associated indicator reflects valid data stored therein comprises successively refreshing non-contiguous independently refreshable memory units.

15. The method of claim 1 wherein refreshing only the independently refreshable memory units whose associated indicator reflects valid data stored therein comprises:
   receiving a refresh command;
   inspecting the indicator associated with the current refresh address; and
   if the indicator reflects valid data, refreshing the addressed independently refreshable memory unit.

16. The method of claim 14 further comprising, if the indicator reflects invalid data, suppressing the refresh cycle.

17. The method of claim 14 further comprising, if the indicator reflects valid data, incrementing the refresh address to the next independently refreshable memory unit having an indicator reflecting valid data.

18. The method of claim 16 further comprising reducing the refresh frequency proportionally to the number of skipped refresh addresses.

19. A DRAM component, comprising:
   a DRAM array operative to store data, the DRAM array organized as a plurality of independently refreshable memory units;
   a plurality of indicators, each associated with an independently refreshable memory unit and indicating whether valid data is stored in the independently refreshable memory unit; and
   a controller receiving control signals and operative to inspect the indicators and to refresh only the independently refreshable memory units storing valid data.

20. The DRAM component of claim 19 further comprising a refresh counter operative to generate the addresses of independently refreshable memory units in the DRAM array.

21. The DRAM component of claim 19 further comprising a circuit operative to set an indicator when data is written to the associated independently refreshable memory unit.

22. The DRAM component of claim 19 wherein the indicators are cleared during initialization.

23. The DRAM component of claim 19 the controller is further operative to set or clear the indicators in response to control signals.

24. The DRAM component of claim 19 wherein the indicators are stored in one or more independently refreshable memory units.

25. The DRAM component of claim 19 wherein the indicators are stored in memory distinct from the DRAM array.

26. A computer readable medium including at least a memory manager computer program operative to perform the steps of:
   receiving a requests from a software task to allocate memory to the task;
   allocating memory to the task from one or more independently refreshable memory units in a memory device; and
   setting an indicator associated with each independently refreshable memory unit to direct the memory device not to suppress refresh operations directed to the independently refreshable memory unit.

27. The computer readable medium of claim 26 wherein the memory manager computer program is further operative to perform the steps of:
   receiving a request from the software task to free memory previously allocated to the task;
   freeing memory previously allocated to the task; and
   if all of the memory in an independently refreshable memory unit has been freed, clearing the associated indicator to direct the memory device to suppress refresh operations directed to that independently refreshable memory unit.

28. The computer readable medium of claim 26 wherein the memory manager computer program allocates memory to a plurality of software tasks executing on a single processor.

29. The computer readable medium of claim 26 wherein the memory manager computer program allocates memory to two or more software tasks, each executing on a different processor.

30. The computer readable medium of claim 26 wherein the memory manager computer program sets an independently refreshable memory unit indicator upon initially writing data to the associated independently refreshable memory unit.

* * * * *